(12) United States Patent
Ma et al.

(10) Patent No.: US 11,977,116 B2
(45) Date of Patent: May 7, 2024

(54) CURRENT TEST CIRCUIT, DEVICE AND METHOD, AND STORAGE MEDIUM

(71) Applicant: CHANGXIN MEMORY TECHNOLOGIES, INC., Hefei (CN)

(72) Inventors: Maosong Ma, Hefei (CN); Zhangqin Zhou, Hefei (CN); Xinwang Chen, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 325 days.

(21) Appl. No.: 17/444,893

(22) Filed: Aug. 11, 2021

(65) Prior Publication Data
US 2022/0082619 A1    Mar. 17, 2022

Related U.S. Application Data

(63) Continuation of application No. PCT/CN2021/095486, filed on May 24, 2021.

(30) Foreign Application Priority Data

Sep. 16, 2020   (CN) .......................... 202010974536.9

(51) Int. Cl.
*G01R 31/317*    (2006.01)
(52) U.S. Cl.
CPC .............. *G01R 31/31724* (2013.01)
(58) Field of Classification Search
CPC .......................... G01R 31/00; G01R 31/31724
(Continued)

(56) References Cited

U.S. PATENT DOCUMENTS

| | | | |
|---|---|---|---|
| 6,181,263 B1 * | 1/2001 | Malik | ..................... H03M 1/06 341/118 |
| 2021/0257007 A1 * | 8/2021 | Kota | .................... G11C 7/1087 |

FOREIGN PATENT DOCUMENTS

| | | |
|---|---|---|
| CN | 106500847 A | 3/2017 |
| CN | 207730833 U | 8/2018 |

(Continued)

OTHER PUBLICATIONS

DDR4/LPDDR4 Standard, IDD specification Parameters and Test conditions, Solid State Technology Association 3103 North 10th Street Arlington, Virginia 22201, Committee Letter Ballot, Committee: JC42.3C, Committee Item No. 1716.78E, Subject: Proposed DDR4 Full spec update(79-4D) with Edits, In 2011.

*Primary Examiner* — Vincent Q Nguyen
(74) *Attorney, Agent, or Firm* — Syncoda LLC; Feng Ma

(57) ABSTRACT

A current test circuit can include a sampling resister array with a control end connected with a main control component, a first end is connected with a power conversion circuit, and a second end configured to be connected with a component to be tested. The sampling resistor array includes at least two sampling branches, each having an analog switch and a sampling resistor connected serially. In the test, the main control component can generate a control signal according to the operating state of the component and gate at least one sampling branch of the sampling resistor array through the control signal, obtain voltage values at two ends of the sampling resistor array through a voltage test assembly, and determine the current of the component according to the voltage values at two ends of the sampling resistor array and resistance values of the sampling resistor array.

16 Claims, 8 Drawing Sheets

(58) Field of Classification Search
USPC .............................................. 324/750.01, 605
See application file for complete search history.

(56) References Cited

FOREIGN PATENT DOCUMENTS

| | | |
|---|---|---|
| CN | 109116094 A | 1/2019 |
| CN | 110927583 A | 3/2020 |
| CN | 110940926 A | 3/2020 |

\* cited by examiner

CURRENT TEST CIRCUIT, DEVICE AND METHOD, AND STORAGE MEDIUM

CROSS-REFERENCE TO RELATED APPLICATIONS

This is a continuation of International Patent Application No. PCT/CN2021/095486 filed on May 24, 2021, which claims priority to Chinese Patent Application No. 202010974536.9 filed on Sep. 16, 2020. The disclosures of these applications are hereby incorporated by reference in their entirety.

BACKGROUND

With the development of big data, cloud computing, Internet of Things, artificial intelligence and other industries, memory chips have become an indispensable component of semiconductor devices, and play an increasingly important role in the entire industrial chain of electronic devices. There are many types of memory chips, and different types of memory chips have different performances. Performance test of memory chips plays an important role in practical applications.

SUMMARY

The present application relates generally to the field of integrated circuits, and more specifically to a current test circuit, device and method, and a storage medium.

The present application provides a current test circuit, device and method, and a storage medium to overcome the problems of low test accuracy and narrow application range due to the small particle size of the minimum current that can be resolved by the existing chip test circuit.

In the first aspect, embodiments of the present application provide a current test circuit, including: a main control component, a sampling resistor array, a voltage test assembly, and a power conversion circuit.

A control end of the sampling resistor array is connected with the main control component. A first end of the sampling resistor array is connected with the power conversion circuit, and a second end of the sampling resistor array is configured to be connected with a component to be tested. The sampling resistor array includes at least two sampling branches, and each sampling branch includes an analog switch and a sampling resistor which are connected serially.

The main control component is configured to generate, when the component to be tested is tested, a control signal according to the operating state of the component to be tested, and gate at least one sampling branch of the sampling resistor array through the control signal, obtain voltage values at two ends of the sampling resistor array through the voltage test assembly, and determine the current of the component to be tested according to the voltage values at two ends of the sampling resistor array and resistance values of the sampling resistor array.

In a possible design of the first aspect, the number of signal bits of the control signal is consistent with the number of sampling branches included in the sampling resistor array, and each signal bit of the control signal is used to control the on-off state of the analog switch in one sampling branch.

Optionally, a sampling resistance value of each sampling branch is equal to the sum of resistance values of an internal resistor of the analog switch and the sampling resistor in the sampling branch.

The actual resistance value of the sampling resistor array is equal to the resistance value after all gated sampling branches are connected in parallel.

In another possible design of the first aspect, the main control component includes: a Double Date Rate (DDR) interface and an input-output interface.

The main control component is configured to communicate with the component to be tested through the DDR interface, and send a control signal to the sampling resistor array through the input-output interface.

Optionally, the main control component is configured to control the operating state of the component to be tested through the DDR interface.

In yet another possible design of the first aspect, the voltage test assembly includes: an operational amplifier and an analog-to-digital converter.

The operational amplifier is configured to collect the voltage values at two ends of the sampling resistor array and amplify the voltage values; and the analog-to-digital converter is configured to perform analog-to-digital conversion on the voltage values processed with the operational amplifier.

In yet another possible design of the first aspect, the power conversion circuit is connected to the main control component and the sampling resistor array; the power conversion circuit is configured to connect to a power supply, and supply power to the main control component and the component to be tested when the main control component tests the component to be tested.

In the second aspect, the embodiments of the present application provide a current test device, including: a component to be tested, and the current test circuit in the first aspect and each possible design.

Optionally, the component to be tested is any of the following components:

memory chip, system chip, chip module, and electronic component.

Optionally, the component to be tested is a Synchronous Dynamic Random Access Memory (SDRAM).

In the third aspect, the embodiments of the present application provide a current test method, which may include the following operations.

The main control component generates a first control signal according to the first operating state of the component to be tested, the first operating state having a corresponding relationship with the first control signal, and the first operating state being a preset operating state of the component to be tested.

The main control component controls a sampling resistor array in the first gated state through the first control signal.

The main control component obtains the first voltage value of the sampling resistor array in the first gated state through a voltage test assembly.

The main control component determines the current of the component to be tested in the first operating state according to the first voltage value and the first resistance value of the sampling resistor array in the first gated state.

In a possible design of the third aspect, the number of signal bits of the first control signal is consistent with the number of sampling branches included in the sampling resistor array, and each signal bit of the first control signal is used to control the on-off state of the analog switch in a sampling branch.

Optionally, before the main control component generates the first control signal according to the first operating state of the component to be tested, the method may further include the following operations.

The main control component determines whether the current operating state of the component to be tested is consistent with the first operating state.

When the current operating state is not consistent with the first operating state, the main control component switches the operating state of the component to be tested to the first operating state through a DDR interface.

The main control component controlling the sampling resistor array in the first gated state through the first control signal may include the following operation.

The main control component sends a first control signal to the sampling resistor array through an input-output interface, so as to control the sampling resistor array in the first gated state.

In another possible design of the third aspect, the voltage test assembly includes: an operational amplifier and an analog-to-digital converter.

The main control component obtains the first voltage value at two ends of the sampling resistor array in the first gated state through the voltage test assembly, which may include the following operation.

The main control component reads the first voltage value of the sampling resistor array in the first gated state from the analog-to-digital converter. The first voltage value is obtained by performing analog-to-digital conversion on a first analog signal with the analog-to-digital converter, and the first analog signal is a voltage signal obtained by performing sampling and amplification on the sampling resistor array in the first gated state with the operational amplifier.

In yet another possible design of the third aspect, after the main control component determines the current of the component to be tested in the first operating state according to the first voltage value and the first resistance value of the sampling resistor array in the first gated state, the method may further include the following operations.

The main control component sends a reset control signal to the sampling resistor array, where the reset control signal is used to control all sampling branches in the sampling resistor array to be in an initial gated state.

The main control component switches the operating state of the component to be tested to a second operating state, the second operating state being the same or different from the first operating state.

The main control component generates a second control signal according to the second operating state, and sends the second control signal to the sampling resistor array, and the second control signal is used to control the sampling resistor array in a second gated state.

The main control component determines the second resistance value and the second voltage value of the sampling resistor array in the second gated state.

The main control component determines the current of the component to be tested in the second operating state according to the second voltage value and the first resistance value.

Optionally, the current test method may further include the following operations.

The main control component obtains current test results of the component to be tested in all preset operating states.

The main control component determines the current operating range of the component to be tested according to the current test results of the component to be tested in all preset operating states.

In the fourth aspect, the embodiments of the present application provide a computer-readable storage medium, which stores computer-executable instructions. When executed by a processor, the computer-executable instructions are used to implement the current test method in the third aspect and each possible design.

The embodiments of the present application provide a current test circuit, device and method, and a storage medium. The current test circuit includes a main control component, a sampling resistor array, a voltage test assembly, and a power conversion circuit. By controlling the control end of the sampling resistor array to be connected with the main control component, the first end is connected to the power conversion circuit, and the second end is configured to be connected to the component to be tested. The sampling resistor array includes at least two sampling branches, and each sampling branch includes an analog switch and a sampling resistor which are connected serially. When the component to be tested is tested, the main control component may generate a control signal according to the operating state of the component to be tested, gate at least one sampling branch of the sampling resistor array through the control signal, obtain the voltage values at two ends of the sampling resistor array through the voltage test assembly, and determine the current of the component to be tested according to the voltage values at two ends of the sampling resistor array and the resistance values of the sampling resistor array. In the technical solution, the application range of the current test circuit is increased, the particle size of current that can be resolved is enlarged, and the accuracy of the current test is improved.

DETAILED DESCRIPTION

Figure 1:
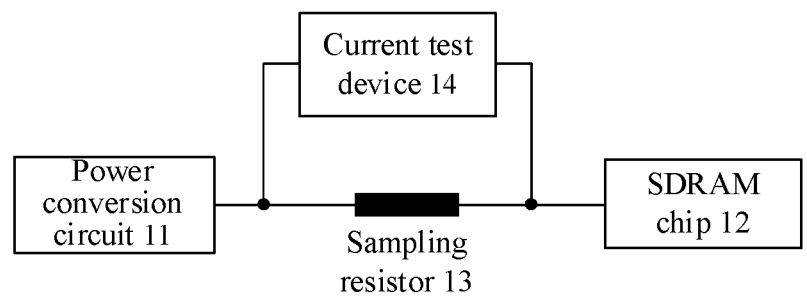
FIG. 1 is a schematic diagram of a test circuit for testing the current and power consumption of a SDRAM chip.

In order to make the purpose, technical solutions and advantages of present application clearer, the technical solutions in the embodiments of the present application will be described clearly and completely below in combination with the accompanying drawings. It is apparent that the described embodiments are a part of the embodiments of the present application, but not all of the embodiments. Based on the embodiments in the application, all other embodiments obtained by those of ordinary skill in the art without creative work shall fall within the range of protection of the application.

Chips, also known as microcircuits, microchips, and integrated circuits, are a general term for semiconductor component products, and are formed by placing an integrated circuit formed by a large number of microelectronic components (transistors, resistors, capacitors, etc.) on a substrate. Due to the rapid development of chips in modern computing, communication, manufacturing, transportation systems, the Internet and other fields, computers, mobile phones, and other digital appliances become an indispensable part of the social structure.

Memory chips have important applications in enterprise-class storage systems, and provide high-quality support for access performance, storage protocols, management platforms, storage media, and a variety of applications. As there are many kinds of memory chips, the performance of different kinds of memory chips is different, and in order to ensure that the chip can fully realize the function and performance indexes specified in the design specification under bad conditions, chip testing is an important link in the production process to ensure chip yield and cost control.

In some embodiments, a SDRAM chip is a common dynamic random access memory chip with a synchronous interface in electronic devices, and it can receive external instructions to keep in sync with a computer. Compared with other memories, SDRAM chips have the advantages of high speed, large capacity, low price, and high level of integration. However, after the design of SDRAM is completed, it may be necessary to carry out a number of tests on it in order to detect whether it fully meets the required performance.

A typical test process of a chip test circuit involves connecting serially a sampling resistor between a memory chip and a power conversion circuit; first, a voltage drop at two ends of the sampling resistor is measured using a multimeter or an ammeter and other devices; then the dynamic current of the chip and the power consumption of the chip are calculated based on the voltage drop and the value of the sampling resistor; finally, the performance of the chip is determined according to the dynamic current and the power consumption of the chip.

In some applications, because the voltage at two ends of the memory chip needs to meet a certain condition during normal operation, the voltage drop at two ends of the sampling resistor needs to be less than a first preset voltage value, for example, 50 mV, while the resistance voltage drop measured with the multimeter or the ammeter and other devices operating correctly needs to be greater than a second preset voltage value, for example, 500 uV. As a result, the minimum current that can be resolved by the chip test circuit is about 5 mA, and the chip test circuit can no longer resolve the current of smaller particle size, so there are problems of low test accuracy and narrow application range.

In an example, dynamic current of the SDRAM chip during operation is usually tested to calculate the power consumption of the SDRAM chip. For example, FIG. 1 is a schematic diagram of a test circuit used to test the current and power consumption of a SDRAM chip. As illustrated in FIG. 1, the test circuit may include: a power conversion circuit 11, a SDRAM chip 12, and a sampling resistor 13 connected between the power conversion circuit 11 and the SDRAM chip 12.

In some applications, first a sampling resistor of 10 mohm to 100 mohm is inserted at a certain position between the power conversion circuit 11 and the SDRAM chip 12; then a voltage drop value at two ends of the sampling resistor 13 is measured using current test devices 14 like a multimeter or an ammeter, and the voltage drop value is divided by the value of the sampling resistor 13 to obtain the current flowing through the SDRAM chip 12, that is, a current value flowing through the SDRAM chip 12; finally, the current value is multiplied by the voltage value on the SDRAM chip 12, so that the power consumption of the SDRAM chip 12 can be obtained.

The test circuit is widely used in various hardware systems to measure the current and power consumption of the chip. The test circuit only needs a sampling resistor to cooperate with the external current test devices to complete the current and power consumption measurement, so the circuit structure is simple.

However, SDRAM chips can operate in a number of different operating states, such as a self-refreshing state, a continuous reading state, and a power-saving state. When the SDRAM chip operates in different states, the current consumption of the chip varies greatly, ranging from a few microamps to several hundred milliamperes, which is a very high dynamic range; for example, the current consumed by the SDRAM chip in a deep power down mode is about 5 µA to 30 µA, and the current consumed in an operating state of continuously reading is about 200 mA to 500 mA.

In addition, since the sampling resistor 13 connected between the power conversion circuit 11 and the SDRAM chip 12 obtains a certain voltage value during operation, the voltage at its two ends also needs to meet a certain condition during normal operation. Therefore, in order to meet the requirements of the chip operating voltage range, there are certain requirements when selecting the sampling resistor there are certain requirements for selecting the sampling resistor. Generally, it is required that the voltage drop generated at two ends of the sampling resistor should not exceed a preset voltage value, for example, 50 mV. For example, the maximum operating current of the SDRAM chip may reach 500 mA, and in order to meet the requirement of the voltage drop of 50 mV, the value of sampling resistance should not exceed 100 mohm.

The voltage drop at two ends of the resistor which needs to be measured with the commonly used multimeter or ammeter cannot be less than a certain value, for example, 500 uV, otherwise it is impossible to accurately resolve whether the voltage value measured with the multimeter or the ammeter is the voltage drop at two ends of the resistor or a background voltage noise of the instrument itself. Therefore, the minimum current that can be resolved by the existing current test circuit is about 5 mA, and smaller current cannot be resolved.

In order to solve the above problems, current testing devices with higher accuracy can be used to increase the current measurement range, for example, using the CX3300 current analyzer with the CX1215A probe. If the value of the sampling resistor is 53 mohm, the current measurement range of the chip that can be measured with the current test device is 440 µA to 500 mA. If the value of the sampling resistor is 1 ohm, the current measurement range of the chip that can be measured with the current test device is 22 µA to 25 mA.

However, in practical applications, the current of the SDRAM chips in different operating states is far beyond the range of 440 µA to 500 mA or 22 µA to 25 mA, and usually reaches the range of 10 µA to 500 mA, so the existing current test circuit cannot fully meet the current test requirements of the SDRAM and other chips with a high dynamic range.

The current test circuit provided in the embodiments of the present application relates to semiconductor memory technology, in particular the test validation of the SDRAM chip, which can accurately test the current and power consumption of the chip in different operating states. Specifically, by running a main control chip with a current test program stored, the current measurement range of the chip can be expanded by using the program, and the current resolution of the SDRAM chip with a large dynamic range of current is improved.

The technical solutions of the present application are described in detail through specific embodiments below. It is to be noted that the following specific embodiments may be combined, and the same or similar concepts or processes may not be described in some embodiments.

Figure 2:
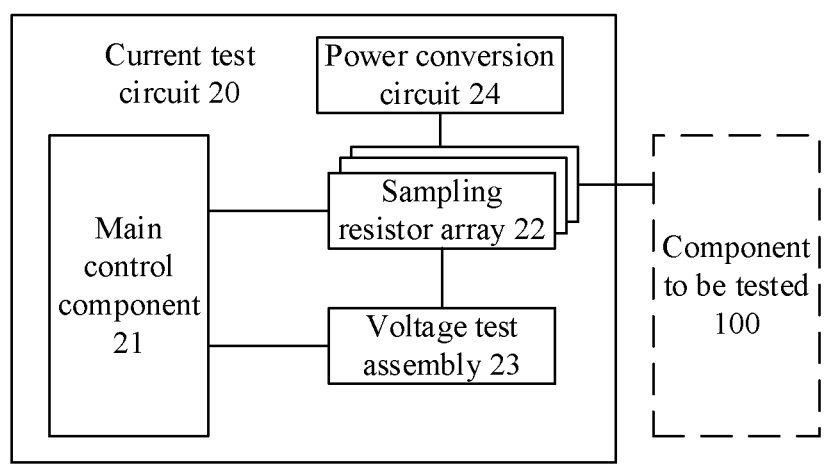
FIG. 2 is a structure diagram of a current test circuit provided by the first embodiment of the present application.

FIG. 2 is a structure diagram of a current test circuit provided by the first embodiment of the present application. As illustrated in FIG. 2, the current test circuit 20 may include: a main control component 21, a sampling resistor array 22, a voltage test assembly 23, and a power conversion circuit 24.

A control end of the sampling resistor array 22 is connected with the main control component 21. A first end of the sampling resistor array 22 is connected with the power conversion circuit 24, and a second end of the sampling resistor array 22 is configured to be connected with a component to be tested 100. The sampling resistor array 22 includes at least two sampling branches, and each sampling branch includes an analog switch and a sampling resistor which are connected serially.

The main control component 21 is configured to generate, when the component to be tested 100 is tested, a control signal according to the operating state of the component to be tested 100, gate at least one sampling branch of the sampling resistor array 22 through the control signal, obtain voltage values at two ends of the sampling resistor array 22 through the voltage test assembly 23, and determine the current of the component to be tested 100 according to the voltage values at two ends of the sampling resistor array 22 and resistance values of the sampling resistor array 22.

In this embodiment, when the component to be tested 100 needs to be tested, the component to be tested 100 can be connected to the current test circuit 20 so that the sampling resistor array 22 is connected between the main control component 21 and the component to be tested 100. At the same time, after the current test circuit 20 is powered on, the main control component 21 can send a command to the component to be tested 100, so as to control the component to be tested 100 to operate in a target operating state.

Optionally, the corresponding relationship between the operating state of the component to be tested 100 and the operating range of current may be preset in the main control component 21. When the main control component 21 needs to test the performance of the component to be tested 100 in the target operating state, the resistance value that needs to be connected to the current test circuit 20 can be estimated, and then a control signal is generated according to the number of branches of the sampling resistor array 22 and the resistance value of each branch. At least one sampling branch of the sampling resistor array 22 is gated by sending the control signal to the sampling resistor array 22.

Optionally, the resistance value information of each sampling branch is preset in the main control component 21. After the main control component 21 sends the control signal to the sampling resistor array 22, the resistance value of the sampling resistor array 22 can be determined.

It can be understood that in the solutions of the present application, the number of signal bits of the control signal is consistent with the number of sampling branches included in the sampling resistor array 22, and each signal bit of the control signal is used to control the on-off state of the analog switch in one sampling branch.

Optionally, the signal bit of the control signal can use "0" to represent an ungated state, and use "1" to represent the gated state. The main control component 21 determines whether the sampling branch corresponding to the signal bit is gated according to the value of each signal bit in the control signal, and then calculates the total resistance value of the sampling resistor array 22 according to the resistance values of all the gated sampling branches.

In this embodiment, the voltage test assembly 23 is connected to two ends of the sampling resistor array 22, therefore, after the current test circuit 20 is powered on, the voltage test assembly 23 can collect the voltage values at two ends of the sampling resistor array 22, so that the main control component 21 can read the voltage values at two ends of the sampling resistor array 22 from the voltage test assembly 23, and finally calculate the current flowing through the sampling resistor array 22 by combining the voltage values at two ends of the sampling resistor array 22 and the resistance value of the sampling resistor array 22. Since the sampling resistor array 22 and the component to be tested 100 are connected to the same branch, the current flowing through the sampling resistor array 22 is the current of the component to be tested 100.

In this solution, there can be multiple types of selection of the main control component 21, such as a programmable logic chip and a data processing chip. The embodiments of the present application do not limit the specific type of the main control component 21. The programmable logic chip can be a chip that has logic functions according to the user's programming the device, for example, a Field Programmable Gate Array (FPGA) chip, a Complex Programmable Logic Device (CPLD), etc. The data processing chip can either be a common electronic control chip in daily life, such as a Micro Controller Unit (MCU) chip, or a chip with multiple functions, high performance and low power consumption, such as a System on a Chip (SOC).

It is understandable that in the embodiments of the present application, the main control element 21 may store a program for performing a current test method, and by running the program, the main control component 21 can control the component to be tested 100 to operate in the target operating state, control the resistance value of sampling resistor array 22, and calculate the current value flowing through the component to be tested 100 according to the obtained voltage at two ends of sampling resistor array 22 and the resistance value of sampling resistor array 22.

In this solution, the component to be tested 100 may be a memory chip or module, such as an SDRAM chip, or other types of devices or chips, such as a processor and a management chip. The embodiments of the present application do not limit the specific type of the component to be tested 100, which can be determined according to actual scenarios.

In the current test circuit provided by the embodiments of the present application, the control end of the sampling resistor array is connected with the main control component, the first end is connected with the power conversion circuit, and the second end is configured to be connected with the component to be tested. The sampling resistor array includes at least two sampling branches, and each sampling branch includes the analog switch and the sampling resistor which are connected serially. The main control component is configured to generate, when the component to be tested is tested, the control signal according to the operating state of the component to be tested, gate at least one sampling branch of the sampling resistor array through the control signal, obtain the voltage values at two ends of the sampling resistor array through the voltage test assembly, and determine the current of the component to be tested according to the voltage values at two ends of the sampling resistor array and the resistance values of the sampling resistor array. In this technical solution, since the sampling resistor array includes multiple sampling branches, the control function of the main control component is used to gate the sampling branches of the sampling resistor array, so that the operating current of the component to be tested is different, the range of application of the current test circuit is expanded, the particle size of current that can be resolved is enlarged, and the accuracy of current test is improved.

Figure 3:
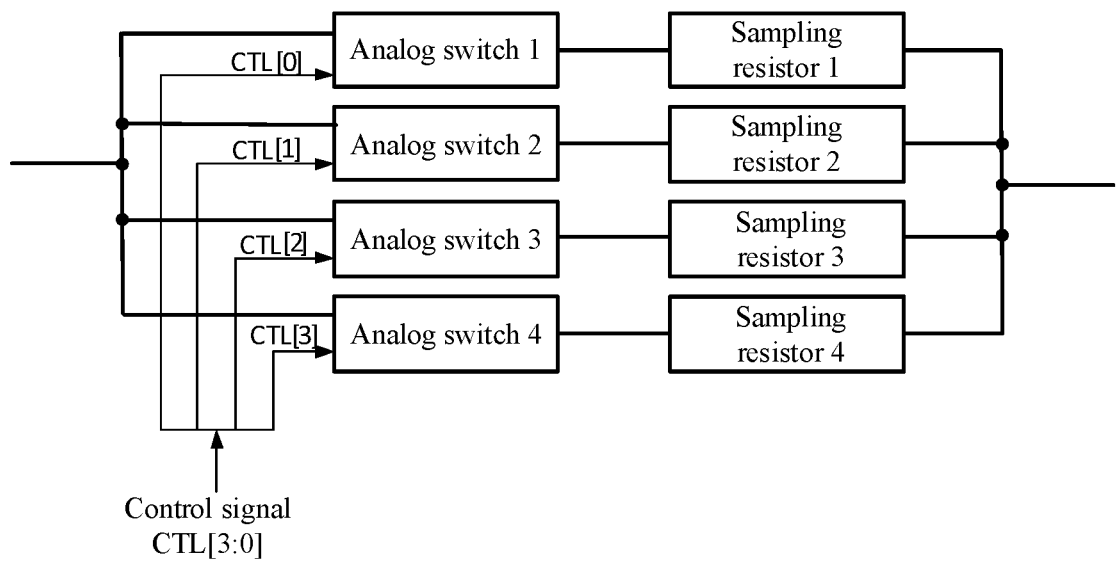
FIG. 3 is a structure diagram of a sampling resistor array in the current test circuit illustrated in FIG. 2.

In some embodiments, FIG. 3 is a structure diagram of a sampling resistor array in the current test circuit illustrated in FIG. 2. As illustrated in FIG. 3, in the current test circuit 20 of the present application, the sampling resistor array 20 includes at least two sampling branches, and each sampling branch includes an analog switch and sampling resistor which are connected serially. Therefore, the sampling resistance value of each sampling branch is equal to the sum of resistance values of an internal resistor of the analog switch and the sampling resistor in the sampling branch. The actual resistance value of the sampling resistor array 22 is equal to the resistance value after all gated sampling branches are connected in parallel.

In practical applications, for a certain sampling branch in the sampling resistor array 22, when the analog switch of the sampling branch is turned on, the sampling branch will be connected in parallel with other sampling branches to obtain the actual resistance value of the sampling resistor array 22. When the analog switch of the sampling branch is not turned on, it is equivalent to that the sampling branch is open, and the actual resistance value of the sampling resistor array 22 is obtained by connecting in parallel the sampling resistance values of other sampling branches in the on state.

In some embodiments, for a certain gated sampling branch, if the internal resistance of the analog switch included in the sampling branch is 5 mohm, and the resistance value of the sampling resistor serially connected with the analog switch is 50 mohm, then the sampling resistance value of the sampling branch is 55 mohm. In this solution, the final resistance value (actual resistance value) of the sampling resistor array 22 is obtained by connecting in parallel the sampling resistance values of all the sampling branches in the gated state.

In some embodiments, if taking that the operating current range of the component to be tested 100 is 10 μA to 500 mA as an example, this embodiment is illustrated by the sampling resistor array 22 including four sampling branches as an example.

As illustrated in FIG. 3, sampling branch 1 includes analog switch 1 and sampling resistor 1 which are serially connected, sampling branch 2 includes analog switch 2 and sampling resistor 2 which are serially connected, sampling branch 3 includes analog switch 3 and sampling resistor 3 which are serially connected, and sampling branch 4 includes analog switch 4 and sampling resistor 4 which are serially connected. For example, the resistance value of the sampling resistor 1 is 90 mohm, the resistance value of the sampling resistor 2 is 1 ohm, the resistance value of the sampling resistor 3 is 10 ohm, and the resistance value of the sampling resistor 4 is 100 ohm. In the embodiments of the present application, the internal resistance of the analog switches 1 to 4 is 5 mohm for description.

Optionally, in this embodiment, the component to be tested 100 (for example, an SDRAM chip) requires the voltage drop on the sampling resistor array 22 not to exceed 50 mV. The control signal sent by the main control component 21 is represented by CTL[3:0], and the four signal bits included are CTL[3], CTL[2], CTL[1] and CTL[0]. CTL[3] is used to control the gated state of sampling branch 4, CTL[2] is used to control the gated state of sampling branch 3, CTL[1] is used to control the gated state of sampling branch 2, and CTL[0] is used to control the gated state of sampling branch 1.

In this embodiment, the main control component 21 needs to select different resistance values of the sampling resistor array 22 according to the different operating states of the component to be tested 100, that is, the main control component 21 gates different sampling branches through different control signals, so that the actual resistance value of the sampling resistor array 22 is different and different testable current ranges are obtained. Optionally, when the component to be tested 100 is an SDRAM chip, Table 1 shows the corresponding relationship between the control signal, the actual resistance value of the sampling resistor array, and the testable current range of the current test circuit.

As shown in Table 1, when the control signal CTL[3:0] is equal to 0001, the sampling branch 1 is gated and the analog switch 1 is in the on state; at this time, the actual resistance value of the sampling resistor array 22 is the sampling resistance value (95 mohm) of the sampling branch, namely the sum of the resistance value (90 mohm) of the sampling resistor 1 and the resistance value (5 mohm) of the analog switch 1. Correspondingly, the voltage at two ends of the sampling resistor array 22 is collected by the voltage test assembly and transmitted to the main control component 21. At this time, the main control component 21 can calculate that the testable current range of the current test circuit 20 is 10.5 mA to 526 mA.

In some embodiments, when the main control component 21 controls the SDRAM chip to enter a continuous reading and writing state, it can determine that the operating current range of the component to be tested 100 may be between 100 mA and 500 mA. At this time, the main control component 21 sends a the control signal to the sampling resistor array 22. The control signal can be CTL[3:0]=0001, and the voltage values at two ends of the sampling resistor array 22 are read, so as to calculate the actual current of the main control component 100.

Similarly, when the control signal CTL[3:0] is equal to 0010, the sampling branch 2 is gated and the analog switch 2 is in the on state. At this time, the actual resistance value of the sampling resistor array 22 is the sampling resistance value (1.005 ohm equal to 1005 mohm) of the sampling branch 2, namely the sum of the resistance value (1000 mohm) of the sampling resistor 2 and the resistance value (5 mohm) of the analog switch 1. Correspondingly, the testable current range of the current test circuit 20 is 1 mA to 50 mA.

In some embodiments, when the main control component 21 controls the SDRAM chip to enter a self-refreshing state, the main control component 21 determines that the operating current range of the component to be tested 100 may be between 1 mA and 5 mA. At this time, the main control component 21 sends the control signal to the sampling resistor array 22. The sent control signal may be CTL[3:0]=0010, and the voltage drop at two ends of the sampling resistor array 22 is read, so as to calculate the actual current of the main control component 100.

When the control signal CTL[3:0] is equal to 0100, the sampling branch 3 is gated and the analog switch 3 is in the on state. At this time, the actual resistance value of the sampling resistor array 22 is the sampling resistance value (10 ohm+5 mohm=10.005 ohm) of the sampling branch 3. Since 5 mohm is much less than 10 ohm, the actual resistance value of the sampling resistor array 22 is approximately equal to 10 ohm. Correspondingly, the testable current range of the current test circuit 20 is 100 μA to 5 mA.

When the control signal CTL[3:0] is equal to 1000, the sampling branch 4 is gated and the analog switch 4 is in the on state. At this time, the actual resistance value of the sampling resistor array 22 is the sampling resistance value (100 ohm+5 mohm=100.005 ohm) of the sampling branch 4. Since 5 mohm is much less than 100 ohm, the actual resistance value of the sampling resistor array 22 is approximately equal to 100 ohm. Correspondingly, the testable current range of the current test circuit 20 is 10 μA to 500 μA.

In some embodiments, if the main control component 21 controls the SDRAM chip to enter a power down state, and the main control component 21 predicts that the operating current range of the component to be tested 100 is 50 μA to 500 μA, then the control signal sent by the main control component 21 to the sampling resistor array 22 may be CTL[3:0] equal to 1000, and the voltage drop at two ends of the sampling resistor array 22 is read, so as to calculate the actual current of the main control component 100.

When the control signal CTL[3:0] is equal to 1111, sampling branches 1 to 4 are all gated, and analog switches 1 to 4 are all in the on state, the actual resistance value of the sampling resistor array 22 is the sampling resistance value after the sampling branch 1, the sampling branch 2, the sampling branch 3 and the sampling branch 4 are connected in parallel. Based on that the resistance value of the sampling branch 1 is 95 mohm, the resistance value of the sampling branch 2 is 1005 mohm, the resistance value of the sampling branch 3 is 10.005 ohm, and the resistance value of the sampling branch 4 is 100.005 ohm. It can be obtained that the actual resistance value of the sampling resistor array 22 is equal to 86.8 mohm. Correspondingly, the testable current range of the current test circuit 20 is 11.5 mA to 576 mA.

It is understandable that the embodiments of the present application are illustrated in the above cases, and each signal bit of the control signal may also have other permutations and combinations, which will not be described here.

TABLE 1

The corresponding relationship between the control signal, the actual resistance value of the sampling resistor array and the testable current range of the current test circuit

| Control signal CTL[3:0] | | | | Actual resistance value of sampling resistor array | Testable current range of current test circuit |
|---|---|---|---|---|---|
| CTL[3] | CTL[2] | CTL[1] | CTL[0] | | |
| 0 | 0 | 0 | 1 | 95 mohm | 10.5 mA~526 mA |
| 0 | 0 | 1 | 0 | 1.005 ohm | 1 mA~50 mA |
| 0 | 1 | 0 | 0 | 10 ohm | 100 μA~5 mA |
| 1 | 0 | 0 | 0 | 100 ohm | 10 μA~500 μA |
| 1 | 1 | 1 | 1 | 86.8 mohm | 11.5 mA~576 mA |

Optionally, to sum up, the main control component 21 may gate each sampling branch through the control signal by running the following program:

```
proc current_sense (index) {
  switch $index
  0{
    set_dram_act_precharge( );
    set_res_array(2);    //control signal CTL[3:0]=0010
    wait (10);
    current=read_adc( )/1.005;
  }
  1{
    set_dram_act_read_precharge( );
    set_res_array(1);    //control signal CTL[3:0]=0001
    wait (10);
    current=read_adc( )/0.095;
  }
  2{
    set_dram_standby( );
    set_res_array(4);    //control signal CTL[3:0]=0100
    wait (10);
    current=read_adc( )/10;
  }
  3{
    set_dram_powerdown( );
    set_res_array(4);    //control signal CTL[3:0]=0100
    wait (10);
    current=read_adc( )/10;
  }
  5{
    set_dram_refresh( );
    set_res_array(1);    //control signal CTL[3:0]=0001
    wait (10);
    current=read_adc( )/0.095;
  }
  7{
    set_dram_read( );
    set_res_array(1);    //control signal CTL[3:0]=0001
    wait (10);
    current=read_adc( )/0.095;
  }
  8{
    set_dram_maxpd( );
    set_res_array(8);    //control signal CTL[3:0]=1000
    wait (10);
    current=read_adc( )/100;   //current value of component to be tested at this time
  }
  return $current
```

In the embodiments of the present application, different sampling branches are gated through a control signal, so that the sampling resistor array has different resistance values, which lays a foundation for obtaining the current of the component to be tested in different operating states.

Figure 4:
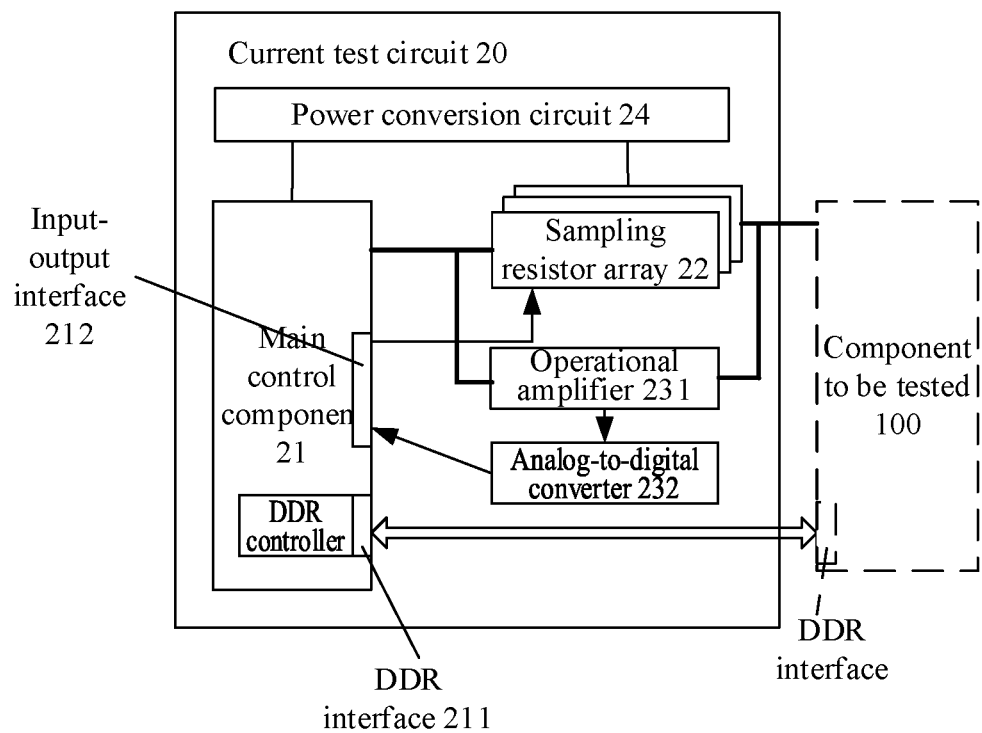
FIG. 4 is a structure diagram of a current test circuit provided by the second embodiment of the present application.

In some embodiments, based on the above embodiment, FIG. 4 is a structure diagram of the current test circuit provided in the second embodiment of the present application. As illustrated in FIG. 4, in the current test circuit 20, the main control component 21 includes: a DDR interface 211 and an input-output interface 212.

The main control component 21 communicates with the component to be tested 100 through the DDR interface 211, and sends a control signal to the sampling resistor array 22 through the input-output interface 212.

In some embodiments, the main control component 21 is configured to control the operating state of the component to be tested 100 through the DDR interface 211.

In this embodiment, the main control component 21 has a DDR memory interface, which may be divided into two parts: a DDR controller and a DDR physical interface (PHY). The main control component 21 controls the information to be sent by the DDR interface 211 through the DDR controller.

In some embodiments, when the main control component 21 tests the SDRAM chip, it can send a command to the SDRAM chip through the DDR interface to control the SDRAM chip to operate in different operating states. In addition, after sending the command to the SDRAM chip to make the SDRAM chip operate in different states, the main control component 21 can also generate control signals through the input-output interfaces to control the gated state of the sampling branch in the sampling resistor array 22.

Furthermore, with reference to FIG. 4, the voltage test assembly 23 may include: an operational amplifier 231 and an analog-to-digital converter 232.

The operational amplifier 231 is configured to collect the voltage values at two ends of the sampling resistor array 22 and amplify the voltage values. The analog-to-digital converter 232 is configured to perform analog-to-digital conversion on the voltage values processed by the operational amplifier.

In this embodiment, two input ends of operational amplifier 231 can be respectively connected to two ends of the sampling resistor array 22, so that when the current test circuit 20 is powered on, the operational amplifier 231 can be used to collect the voltage values at two ends of the sampling resistor array 22, and the collected voltage values can be amplified to obtain an analog voltage signal.

As illustrated in FIG. 4, the analog-to-digital converter 232 is also connected between the operational amplifier 231 and the main control component 21, and the analog-to-digital converter 232 can obtain the voltage analog signal from the operational amplifier 231, and perform analog-to-digital conversion on it to obtain a digital voltage signal. Correspondingly, the main control component 21 can read the digital voltage signal from the analog-to-digital converter 232 to obtain the voltage values at two ends of the sampling resistor array 22.

Optionally, in this embodiment, the minimum resolution of the operational amplifier 231 and the analog-to-digital converter 232 may be 1 mV or 0.1 mV or 0.01 mV. The SDRAM chip requires the voltage drop on the sampling resistor array 22 not to exceed 50 mV so the influence of the sampling resistor array 22 on the current test circuit 20 can be avoided to the greatest extent.

Optionally, in practical applications, the power conversion circuit 24 is connected with the main control component 21 and the sampling resistor array 22, and the power conversion circuit 24 is configured to be connected with a power supply and supply power to the main control component 21 and the component to be tested 100 when the main control component 21 tests the component to be tested 100.

In some embodiments, if it is expected that the current test circuit 20 operates normally, it needs to be powered on, therefore the main control component 21 and the sampling resistor array 22 can be connected to the power conversion circuit 24. When the power conversion circuit 24 is connected to the power supply, the power supply can be used to supply power to the entire current test circuit 20.

Optionally, when the current test circuit 20 is used to test the component to be tested 100, since the component to be tested 100 is connected with the current test circuit 20, the power supply can also supply power to the component to be tested 100 through the power conversion circuit 24.

In this embodiment, by connecting the power conversion circuit in the current test circuit, it can supply power to the main control component, the component to be tested, and so on in the current test circuit, thereby providing a premise for realizing the testing of the component to be tested.

Figure 5:
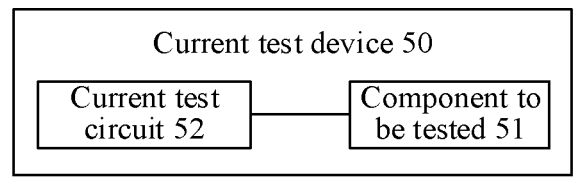
FIG. 5 is a structure diagram of a current test device provided by an embodiment of the present application.

FIG. 5 is a structure diagram of a current test device provided by an embodiment of the present application. As illustrated in FIG. 5, the current test device 50 may include: a component to be tested 51 and a current test circuit 52. The current test circuit 52 is the current test circuit 20 provided in the embodiments illustrated in FIG. 2 to FIG. 4.

Optionally, the structure and implementation principle of the current test circuit 52 may refer to the record of the current test circuit 20 in the embodiments illustrated in FIG. 2 to FIG. 4, which will not be repeated here.

In some embodiments, the component to be tested 51 may be any of the following components:

the memory chip, the system chip, the chip module, and the electronic component.

Optionally, the memory chip may be divided into a Random-Access Memory (RAM) and a Read Only Memory (ROM) according to the function of information storage. RAM can be divided into static RAM and dynamic RAM according to different operating principles of memory cells. Dynamic RAM can also be divided into an Extended Data Out RAM (EDODRAM), a SDRAM, etc.

A system chip can be an integrated circuit with a specific purpose, which contains the entire system and all the contents of the embedded software, for example, a Central Processing Unit (CPU), a Basic Input Output System (BIOS), etc.

The chip module can be a structure formed by encapsulating a variety of chips, and the electronic component can be a general term for components or a combination of multiple components.

It is understandable that the embodiments of the present application do not limit the specific expression forms of the component to be tested 51, which can be determined according to actual scenarios and will not be repeated here.

In a possible design of the present application, the component to be tested is a SDRAM chip, which is a chip with a large dynamic current range. That is, the current test circuit in the embodiments of the present application realizes the test validation of the SDRAM chip, and can achieve the purpose of accurately testing the current and power consumption of the chip in different operating states.

Figure 6:
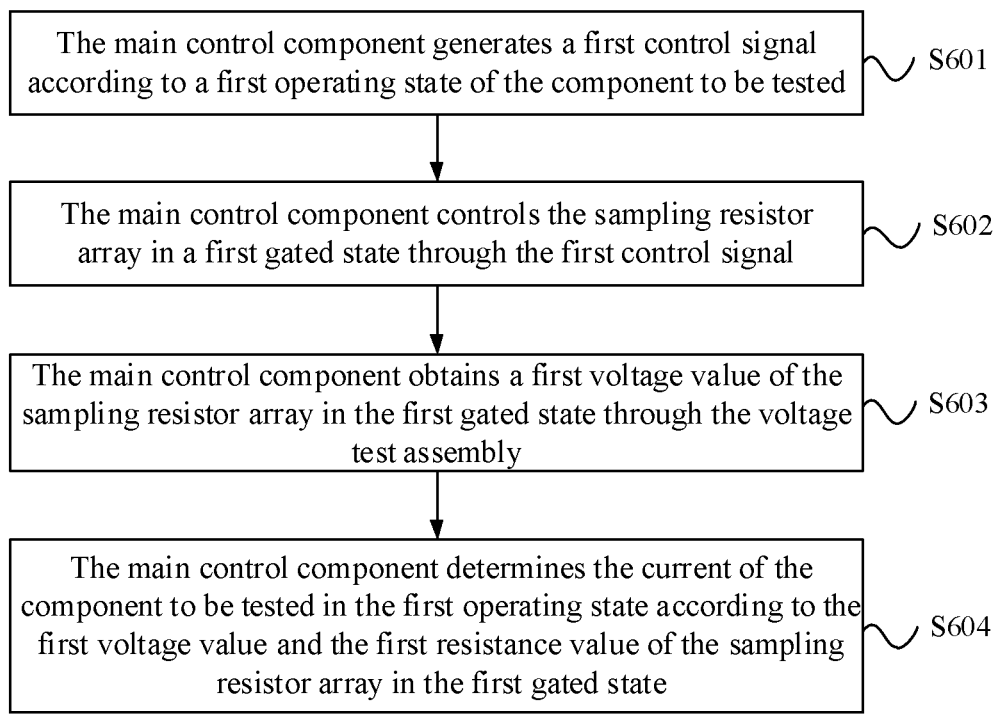
FIG. 6 is a flowchart of a current test method provided by the first embodiment of the present application.

FIG. 6 is a flowchart of the current test method provided by the first embodiment of the present application. The current test method can be applied to the current test device illustrated in FIG. 5. The main control component included by the current test circuit in the current test device illustrated in FIG. 5 is taken as the execution body for explanation. As illustrated in FIG. 6, when the component to be tested is tested using the current test circuit, the current test method may include the following steps.

At S601, the main control component generates a first control signal according to a first operating state of the component to be tested.

The first operating state has a corresponding relationship with the first control signal, and the first operating state is a preset operating state of the component to be tested.

In this embodiment, when using the current test circuit to test the component to be tested, the main control component can first determine the current operating state of the component to be tested, and then generate a control signal according to the current operating state of the component to be tested.

As an example, the component to be tested has multiple preset operating states and can operate in any preset operating state. Assuming that the current operating state of the component to be tested is the first operating state, the main control component can determine the possible operating current of the component to be tested according to the first operating state, and then according to the resistance value of each sampling branch in the sampling resistor array, determine the sampling branch to be gated, generating the first control signal.

Optionally, the first operating state has a corresponding relationship with the first control signal, therefore the main control component determines the first control signal corresponding to the first operating state of the component to be tested according to the first operating state, so as to control the resistance value of the sampling resistor array.

At S602, the main control component controls the sampling resistor array in a first gated state through the first control signal.

In the embodiments of the present application, the sampling resistor array is connected between the main control component and the component to be tested. After generating the first control signal, the main control component can send the first control signal to the sampling resistor array, so that at least one sampling branch in the sampling resistor array is gated, and then the sampling resistor array has a specific resistance value.

In some embodiments, the number of signal bits of the first control signal is consistent with the number of sampling branches included in the sampling resistor array, and each signal bit of the first control signal is used to control the on-off state of the analog switch in one sampling branch. In this way, the main control component can determine the total resistance value of the sampling resistor array.

The specific expression form of the first control signal may refer to the record in the embodiment of the current test circuit and will not be repeated here.

At S603, the main control component obtains a first voltage value of the sampling resistor array in the first gated state through the voltage test assembly.

In this embodiment, the two ends of the sampling resistor array can also be connected in parallel to the voltage test assembly. The voltage test assembly can collect the resistance value of the sampling resistor array, so that the main control component can read the first voltage value at two ends of the sampling resistor array from the voltage test assembly.

In some embodiments, in a possible design of the present application, the voltage test assembly may include: an operational amplifier and an analog-to-digital converter; in this case, the main control component can read the first voltage value of the sampling resistor array in the first gated state from the analog-to-digital converter. The first voltage value is obtained by performing analog-to-digital conversion on a first analog signal by the analog-to-digital converter. The first analog signal is a voltage signal obtained by performing sampling and amplification on the sampling resistor array in the first gated state by the operational amplifier.

Specifically, the operational amplifier can sample and amplify the sampling resistor array in the first gated state to obtain the first analog signal, the analog-to-digital converter can perform analog-to-digital conversion on the first analog signal to obtain the first voltage value. Correspondingly, the main control chip can read the voltage value on the analog-to-digital converter to obtain the first voltage value of the sampling resistor array in the first gated state.

At S604, the main control component determines the current of the component to be tested in the first operating state according to the first voltage value and the first resistance value of the sampling resistor array in the first gated state.

In the embodiments of the present application, the main control component can determine the first resistance value of the sampling resistor array in the first gated state according to the resistance value of each sampling resistor in each sampling branch included in the sampling resistor array and the value of each signal bit in the first control signal, and then in combination with the obtained first voltage value at two ends of the sampling resistor array, divide the first voltage value by the first resistance value to obtain the current value flowing through the sampling resistor array. Since the component to be tested is serially connected with the sampling resistor array, the current value flowing through the sampling resistor array is the same as that flowing through the component to be tested, thereby determining the current of the component to be tested in the first operating state.

In the current test method provided by the embodiments of the present application, the main control component generates the first control signal according to the first operating state of the component to be tested, controls the sampling resistor array in the first gated state through the first control signal, obtains the first voltage value of the sampling resistor array in the first gated state through the voltage test assembly, and finally determines the current of the component to be tested in the first operating state according to the first voltage value and the first resistance value of the sampling resistor array in the first gated state. In this technical solution, the control chip can use the control signal to gate the gated state of each sampling branch in the sampling resistor array according to the operating state of the component to be tested, which can accurately test the current and power consumption of the component to be tested in different operating states, thereby realizing the testing of the chip with a larger dynamic current range and improving the test accuracy.

Figure 7:
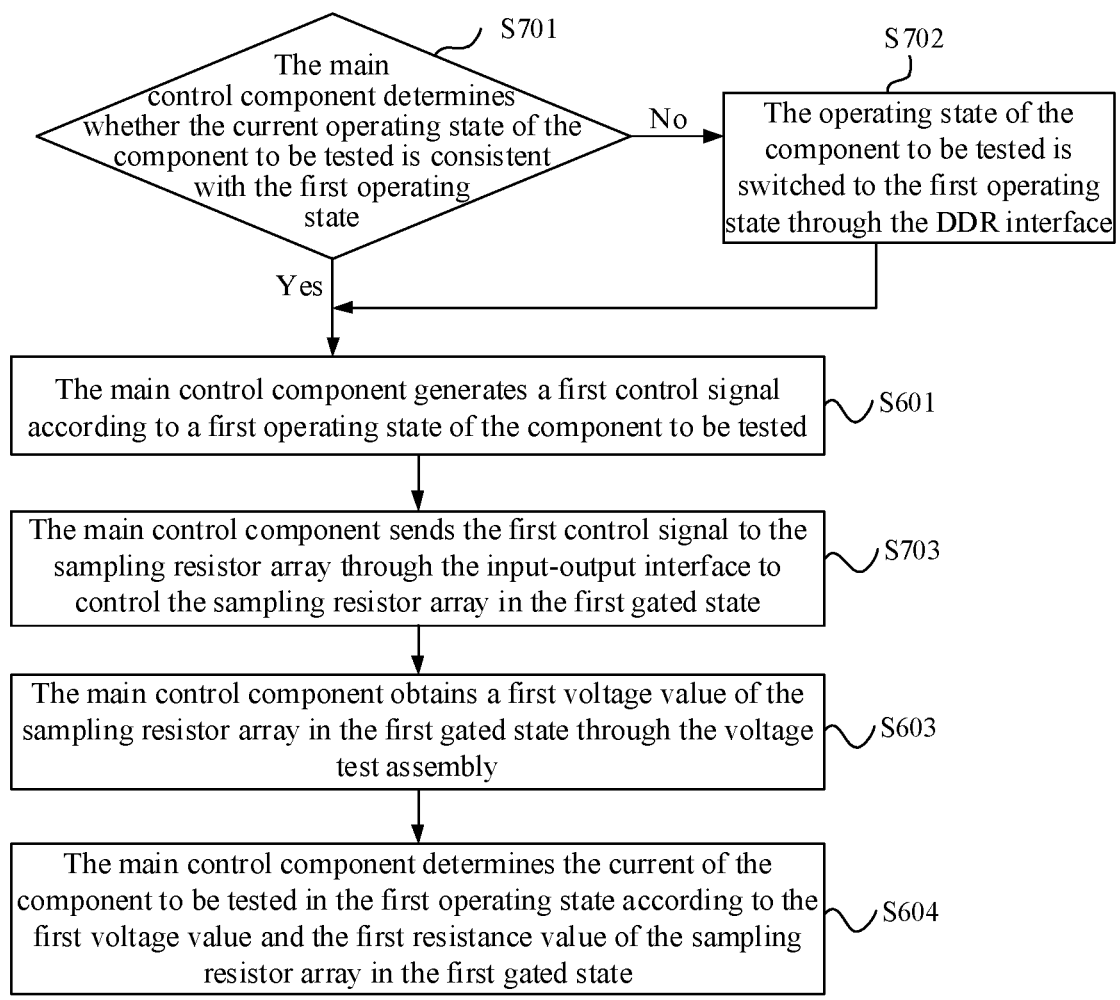
FIG. 7 is a flowchart of a current test method provided by the second embodiment of the present application.

FIG. 7 is a flowchart of a current test method provided by the second embodiment of the present application. In this embodiment, the main control chip includes: a DDR interface and an input-output interface. As illustrated in FIG. 7, before S601, the current test method may also include the following steps.

At S701, the main control component determines whether the current operating state of the component to be tested is consistent with the first operating state; if so, S601 is performed; if not, S702 is performed.

In the embodiments of the present application, if the main control component wants to measure the performance of the component to be tested in the first operating state, it can first determine the current operating state of the component to be tested, and then determine whether the current operating state is the first operating state; if so, S601 is performed to generate the first control signal, so as to control the sampling resistor array in the first gated state; if not, S702 is performed to switch the operating state of the component to be tested to the first operating state.

At S702, the operating state of the component to be tested is switched to the first operating state through the DDR interface.

For example, the main control component and the component to be tested have the DDR interface to ensure the synchronization of the main control component and the component to be tested. When the main control component determines that the current operating state of the component to be tested is not consistent with the first operating state, in order to realize the current test of the component to be tested in the first operating state, the main control component can send a command to the component to be tested through the DDR interface, and correspondingly, the component to be tested can receive the command through the DDR interface it has and switch the operating state to the first operating state based on the command.

Optionally, in the embodiments of the present application, S602 may be implemented through the following steps.

At S703, the main control component sends the first control signal to the sampling resistor array through the input-output interface to control the sampling resistor array in the first gated state.

In some embodiments, the main control chip also has the input-output interface. In this case, when determining that the component to be tested is in the first operating state, the main control component can send the first control signal to the sampling resistor array through the input-output interface, so as to control the sampling resistor array in the first gated state. Specifically, the first gated state of the sampling resistor array has a corresponding relationship with the first control signal.

In the current test method provided by the embodiments of the present application, the main control component determines whether the current operating state of the component to be tested is consistent with the first operating state. If the two are inconsistent, the operating state of the component to be tested is first switched to the first operating state through the DDR interface, and then the first control signal is sent to the sampling resistor array through the input-output interface, so as to control the sampling resistor array in the first gated state. In the technical solutions, the main control chip can guarantee the corresponding relationship among the first operating state, the first control signal and the first gated state through the DDR interface and the input-output interface, which lays a foundation for obtaining a large dynamic range of operating current later.

Figure 8:
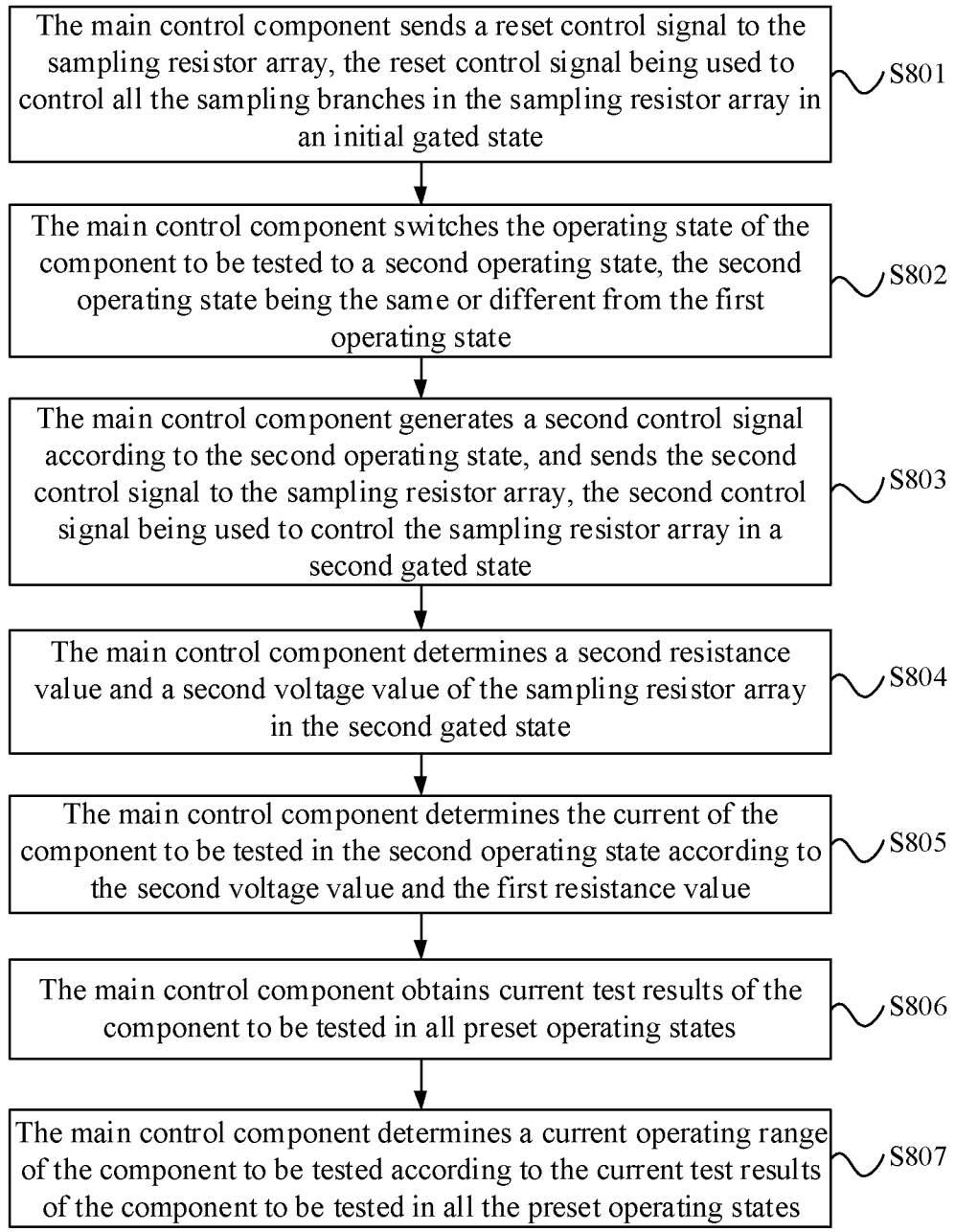
FIG. 8 is a flowchart of a current test method provided by the third embodiment of the present application.

FIG. 8 is a flowchart of a current test method provided by the third embodiment of the present application. As illustrated in FIG. 8, after S601, the current test method may also include the following steps.

At S801, the main control component sends a reset control signal to the sampling resistor array, the reset control signal being used to control all the sampling branches in the sampling resistor array in an initial gated state.

In the embodiments of the present application, in the process of using the current test circuit to test the component to be tested, if the main control component has determined the current of the component to be tested in the first operating state, for example, the main control component has tested the component to be tested in the first operating state for a preset time, or the test result meets a preset requirement, then the main control component sends the reset control signal to the sampling resistor array, so that all the sampling branches in the sampling resistor array are in the initial gated state, and then they can be switched to other gated states.

In a possible design of this embodiment, the initial gated state may be a state where all the analog switches in the sampling resistor array are turned on. In this case, the final resistance value of the sampling resistor array is the minimum state, and the component to be tested can operate in the maximum current mode. In another possible design of this embodiment, the initial gated state can be that some analog switches in the sampling resistor array are in the on state, and other analog switches are in the off state. The embodiments of the present application do not limit the specific form of the initial gated state, which will not be repeated here.

At S802, the main control component switches the operating state of the component to be tested to a second operating state, the second operating state being the same or different from the first operating state.

In this embodiment, the main control component can send a switching command to the component to be tested according to a control program loaded internally, so that the component to be tested switches the operating state to the second operating state.

Optionally, the second operating state can be any of all preset operating states of the component to be tested, and it can be the first operating state or a preset operating state different from the first operating state. The embodiments of the present application do not limit the specific expression form of the second operating state, which can be realized by loading different control programs according to actual requirements.

At S803, the main control component generates a second control signal according to the second operating state, and sends the second control signal to the sampling resistor array, where the second control signal being used to control the sampling resistor array in a second gated state.

In some embodiments, the main control chip can determine, according to an estimated current value of the component to be tested, the sampling branch that can be gated in the sampling resistor array, so as to generate a second control signal, and then switch the sampling resistor array to the corresponding gear, so as to control the sampling resistor array in a second gated state.

For example, for the SDRAM chip, with reference to the corresponding relationship among the control signal, the actual resistance value of the sampling resistor array and the testable current range of the current test circuit shown in Table 1, if it is determined that the current of the component to be tested is about 5 mA to 20 mA, the sampling resistor array is switched to the gear of about 1 ohm, and the second control signal is CTL[3:0] equal to 0010.

At S804, the main control component determines a second resistance value and a second voltage value of the sampling resistor array in the second gated state.

In this embodiment, the main control component can use the corresponding relationship between the first control signal and the sampling resistor array to determine the second resistance value of the sampling resistor array in the second gated state, and then use the voltage test assembly to collect the second voltage value of the sampling resistor array in the second gated state. The specific implementation of this step may refer to the method for obtaining the first resistance value and the second voltage value in the embodiment illustrated in FIG. 7, and will not be repeated here.

At S805, the main control component determines the current of the component to be tested in the second operating state according to the second voltage value and the first resistance value.

Optionally, the main control component divides the second voltage value by the second resistance value to obtain the current value flowing through the sampling resistor array. Since the component to be tested is serially connected with the sampling resistor array, the current value flowing through the sampling resistor array is the same as that flowing through the component to be tested, so that the current of the component to be tested in the second operating state is determined.

In some embodiments illustrated in FIG. 8, the current test method may also include the following steps.

At S806, the main control component obtains current test results of the component to be tested in all preset operating states.

Optionally, if there are multiple preset operating states of the component to be tested and current information of the component to be tested in all the preset operating states needs to be tested, the main control component can perform S801 to S805 circularly until the current test results of the component to be tested in all the preset operating states are obtained.

At S807, the main control component determines a current operating range of the component to be tested according to the current test results of the component to be tested in all the preset operating states.

In this embodiment, the main control component can determine the whole current operating range of the component to be tested by integrating the current test results of the component to be tested in all the preset operating states.

Furthermore, after determining the current of the component to be tested in each preset operating state, the main control component can also obtain the voltage value of the component to be tested in each operating state, so as to determine power consumption information of the component to be tested in each operating state according to the current value and the voltage value in each preset operating state, and then to determine the whole power consumption information of the component to be tested. In this case, the main control component can determine the performance of the component to be tested according to the whole current operating range and the whole power consumption information of the component to be tested.

In the current test method provided by the embodiments of the present application, after determining the current of the component to be tested in the first operating state, the main control component sends a reset control signal to the sampling resistor array to control all the sampling branches in the sampling resistor array in the initial gated state, and then switches the operating state of the component to be tested to the second operating state; correspondingly, the main control component generates a second control signal according to the second operating state, and sends the second control signal to the sampling resistor array to determine the second resistance value and the second voltage value of the sampling resistor array in the second gated state, and then to determine the current of the component to be tested in the second operating state. Similarly, the current information of the component to be tested in all the preset operating states can be determined, thereby realizing the component testing of a large dynamic current range, improving the test accuracy, and expanding the application range of the current test circuit. Moreover, in the present application, all test programs can be stored in the main control chip to realize the automation of the testing of the component to be tested, that is, the main control chip automatically executes all the test programs and completes all testing tasks required by the components to be tested.

The present application also provides a computer-readable storage medium, which stores a computer program. When executed by a processor, the computer program implements the steps of the current test circuit provided in any above method embodiment.

It is to be noted that terms "include" and "contain" or any other variant thereof is intended to cover nonexclusive inclusions herein, so that a process, method, object or device including a series of components not only includes those components but also includes other components which are not clearly listed or further includes components intrinsic to the process, the method, the object or the device. Under the condition of no more limitations, a component defined by the statement "including a/an . . . " does not exclude existence of the same other components in a process, method, object or device including the component.

The sequence numbers of the embodiments of the present application are just for describing, instead of representing superiority-inferiority of the embodiments.

Other implementation solutions of the present application will be apparent to those skilled in the art from consideration of the specification and practice of the present application. The present application is intended to cover any variations, uses, or adaptations of the present application following the general principles thereof and including such departures from the present application as come within known or customary practice in the art. It is intended that the specification and examples be considered as exemplary only, with a true range and spirit of the present application being indicated by the following claims.

What is claimed is:

1. A current test circuit, comprising: a main control component, a sampling resistor array, a voltage test assembly, and a power conversion circuit;
   wherein a control end of the sampling resistor array is connected with the main control component; a first end of the sampling resistor array is connected with the power conversion circuit, and a second end of the sampling resistor array is connected with a to-be-tested component; the sampling resistor array comprises at least two sampling branches, and each sampling branch comprises an analog switch and a sampling resistor that are connected serially;
   the main control component is configured to generate, when the to-be-tested component is tested, a control signal according to an operating state of the to-be-tested component and gate at least one sampling branch of the sampling resistor array through the control signal, obtain voltage values at two ends of the sampling resistor array through the voltage test assembly, and determine a current of the to-be-tested component according to the voltage values at the two ends of the sampling resistor array and resistance values of the sampling resistor array; and
   the voltage test assembly is connected to the two ends of the sampling resistor array and is further connected to the main control component.

2. The current test circuit of claim 1, wherein a number of signal bits of the control signal is consistent with a number of sampling branches comprised in the sampling resistor array, and each signal bit of the control signal is used to control an on-off state of the analog switch in one sampling branch.

3. The current test circuit of claim 2, wherein a sampling resistance value of each sampling branch is equal to a sum of resistance values of an internal resistor of the analog switch and the sampling resistor in the sampling branch;
   an actual resistance value of the sampling resistor array is equal to a resistance value after all gated sampling branches are connected in parallel.

4. The current test circuit of claim 1, wherein the main control component comprises: a Double Data Rate (DDR) interface and an input-output interface;
   the main control component is configured to communicate with the to-be-tested component through the DDR interface, and send the control signal to the sampling resistor array through the input-output interface.

5. The current test circuit of claim 4, wherein the main control component is configured to control the operating state of the to-be-tested component through the DDR interface.

6. The current test circuit of claim 1, wherein the voltage test assembly comprises: an operational amplifier and an analog-to-digital converter;
the operational amplifier is configured to collect the voltage values at the two ends of the sampling resistor array and amplify the voltage values; and the analog-to-digital converter is configured to perform analog-to-digital conversion on voltage values processed by the operational amplifier.

7. The current test circuit of claim 1, wherein the power conversion circuit is connected with the main control component and the sampling resistor array; the power conversion circuit is configured to be connected with a power supply, and supply power to the main control component and the to-be-tested component when the main control component tests the to-be-tested component.

8. The current test circuit of claim 1, wherein the current test circuit is configured to test the to-be-tested component comprising at least one of: memory chip, system chip, chip module, and electronic component.

9. The current test circuit of claim 8, wherein the to-be-tested component is a Synchronous Dynamic Random-Access Memory (SDRAM).

10. A current test method, performed by the current test circuit of claim 1 and comprising:
generating, by the main control component, a first control signal according to a first operating state of the to-be-tested component, wherein the first operating state has a corresponding relationship with the first control signal, and the first operating state is a preset operating state of the to-be-tested component;
controlling, with the main control component, the sampling resistor array in a first gated state through the first control signal;
obtaining, with the main control component, a first voltage value of the sampling resistor array in the first gated state through the voltage test assembly; and
determining, with the main control component, the current of the to-be-tested component in the first operating state according to the first voltage value and a first resistance value of the sampling resistor array in the first gated state.

11. The current test method of claim 10, wherein a number of signal bits of the first control signal is consistent with a number of sampling branches comprised in the sampling resistor array, and each signal bit of the first control signal is used to control an on-off state of an analog switch in one sampling branch.

12. The current test method of claim 11, wherein before generating, with the main control component, the first control signal according to the first operating state of the to-be-tested component, the method further comprises:
determining, with the main control component, whether the current operating state of the to-be-tested component is consistent with the first operating state;
when the current operating state is not consistent with the first operating state, switching, with the main control component, the operating state of the to-be-tested component to the first operating state through a Double Data Rate (DDR) interface;
controlling, with the main control component, the sampling resistor array in the first gated state through the first control signal comprises:
sending, with the main control component, the first control signal to the sampling resistor array through an input-output interface, so as to control the sampling resistor array in the first gated state.

13. The current test method of claim 10, wherein the voltage test assembly comprises: an operational amplifier and an analog-to-digital converter;
obtaining, with the main control component, the first voltage value at the two ends of the sampling resistor array in the first gated state through the voltage test assembly comprises:
reading, with the main control component, the first voltage value of the sampling resistor array in the first gated state from the analog-to-digital converter, wherein the first voltage value is obtained by performing analog-to-digital conversion on a first analog signal with the analog-to-digital converter, and the first analog signal is a voltage signal obtained by performing sampling and amplification on the sampling resistor array in the first gated state with the operational amplifier.

14. The current test method of claim 10, wherein after said determining, with the main control component, the current of the to-be-tested component in the first operating state according to the first voltage value and the first resistance value of the sampling resistor array in the first gated state, the method further comprises:
sending, with the main control component, a reset control signal to the sampling resistor array, wherein the reset control signal is used to control all sampling branches in the sampling resistor array in an initial gated state;
switching, with the main control component, the operating state of the to-be-tested component to a second operating state, wherein the second operating state is the same or different from the first operating state;
generating, with the main control component, a second control signal according to the second operating state, and sending the second control signal to the sampling resistor array, wherein the second control signal is used to control the sampling resistor array in a second gated state;
determining, with the main control component, a second resistance value and a second voltage value of the sampling resistor array in the second gated state; and
determining, with the main control component, the current of the to-be-tested component in the second operating state according to the second voltage value and the first resistance value.

15. The current test method of claim 14, further comprising:
obtaining, with the main control component, current test results of the to-be-tested component in all preset operating states; and
determining, with the main control component, a current operating range of the to-be-tested component according to the current test results of the to-be-tested component in all the preset operating states.

16. A non-transitory computer-readable storage medium, storing a computer-executable instruction, wherein when executed by a processor, the computer-executable instruction is configured to implement a current test method performed by the current test circuit of claim 1 and comprising:
generating, by the main control component, a first control signal according to a first operating state of the to-be-tested component, wherein the first operating state has a corresponding relationship with the first control signal, and the first operating state is a preset operating state of the to-be-tested component:
controlling, with the main control component, the sampling resistor array in a first gated state through the first control signal;

obtaining, with the main control component, a first voltage value of the sampling resistor array in the first gated state through the voltage test assembly; and determining, with the main control component, the current of the to-be-tested component in the first operating state according to the first voltage value and a first resistance value of the sampling resistor array in the first gated state.

* * * * *